United States Patent

Blazic et al.

[11] Patent Number: 6,120,114
[45] Date of Patent: Sep. 19, 2000

[54] SOLENOID COIL STRUCTURE AND INTERCONNECTION

[75] Inventors: Ernest S. Blazic, Ypsilanti; Herbert L. Linkner, Jr., Dexter, both of Mich.

[73] Assignee: Kelsey-Hayes Company, Livonia, Mich.

[21] Appl. No.: 09/253,483

[22] Filed: Feb. 19, 1999

Related U.S. Application Data

[63] Continuation of application No. PCT/US97/14672, Aug. 20, 1997.
[60] Provisional application No. 60/024,195, Aug. 20, 1996, provisional application No. 60/024,507, Aug. 23, 1996, and provisional application No. 60/024,997, Aug. 29, 1996.

[51] Int. Cl.[7] .......................................... B60T 8/36
[52] U.S. Cl. .................... 303/119.2; 303/119.3; 335/255
[58] Field of Search ................ 251/129.01, 129.15; 303/119.2, 119.3, DIG. 10; 335/278, 255

[56] References Cited

U.S. PATENT DOCUMENTS

| | | |
|---|---|---|
| 4,067,541 | 1/1978 | Hunter .................................. 303/119.2 |
| 4,929,038 | 5/1990 | Reinartz et al. . |
| 5,040,853 | 8/1991 | Burgdof et al. ...................... 303/119.3 |
| 5,326,161 | 7/1994 | Adams et al. ....................... 251/129.15 |
| 5,374,114 | 12/1994 | Burgdorf et al. . |
| 5,439,279 | 8/1995 | Linkner, Jr. et al. . |
| 5,449,227 | 9/1995 | Steinberg et al. . |
| 5,482,362 | 1/1996 | Robinson . |
| 5,513,905 | 5/1996 | Zeides et al. . |

FOREIGN PATENT DOCUMENTS

| | | | |
|---|---|---|---|
| 452173 | 10/1991 | European Pat. Off. ............ 303/119.2 |
| 499670 | 8/1992 | European Pat. Off. ............ 303/119.3 |
| 464747 | 8/1975 | U.S.S.R. ................... 335/255 |
| 616777 | 1/1949 | United Kingdom ................... 335/255 |
| 675855 | 7/1952 | United Kingdom ................... 335/255 |

*Primary Examiner*—Chris Schwartz
*Attorney, Agent, or Firm*—MacMillan, Sobanski & Todd, LLC

[57] ABSTRACT

A solenoid coil inverted within a flux casing has at least one lead wire extending through a flux ring mounted in an end of the flux casing. The coil is coupled to a circuit board or overmolded lead frame which is positioned adjacent to a valve body with a solenoid valve sleeve extending through the circuit board or lead frame into the coil. A flexible coupling allows the coil to move relative to the circuit board or lead frame.

6 Claims, 9 Drawing Sheets

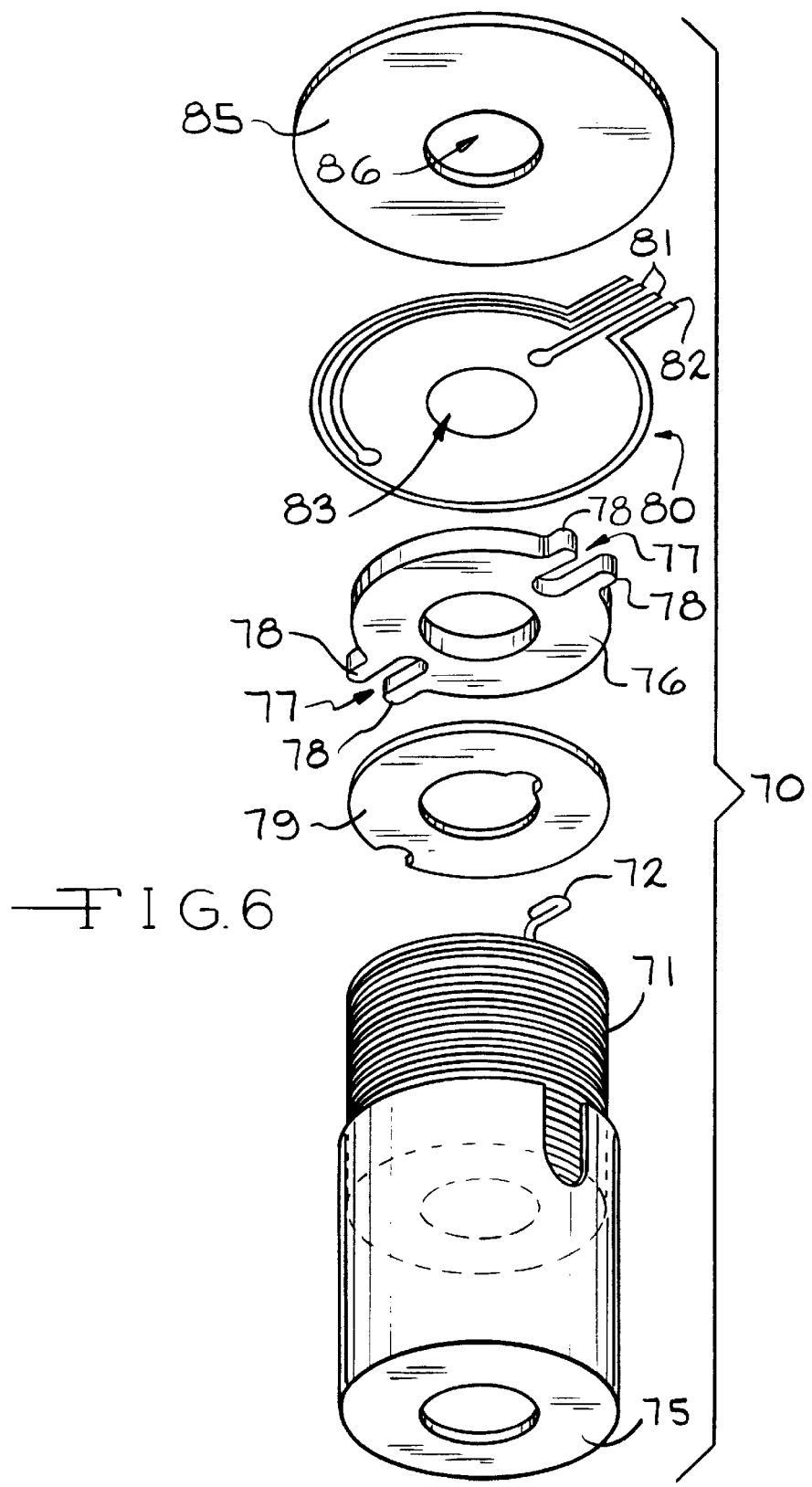

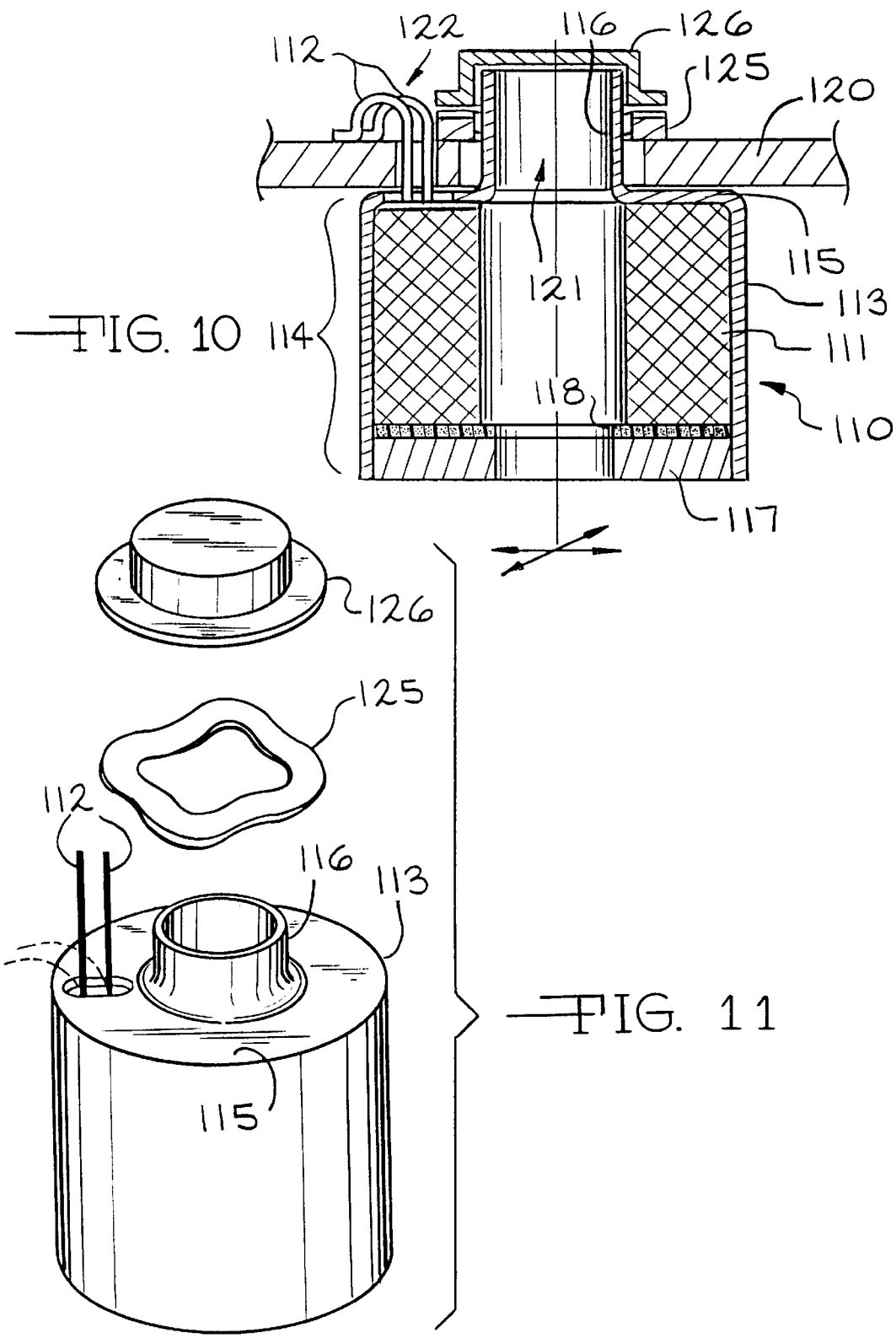

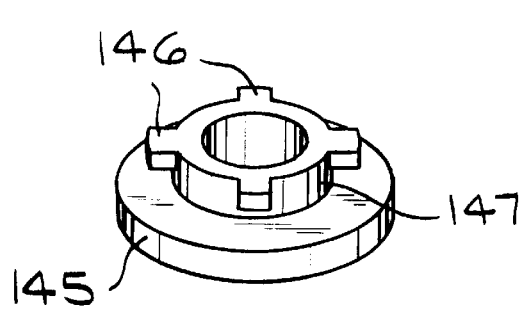
FIG. 14
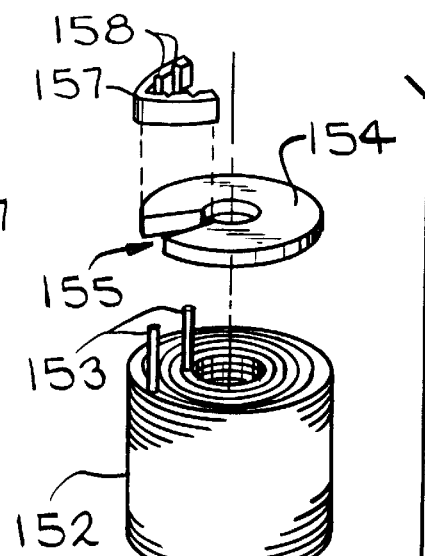
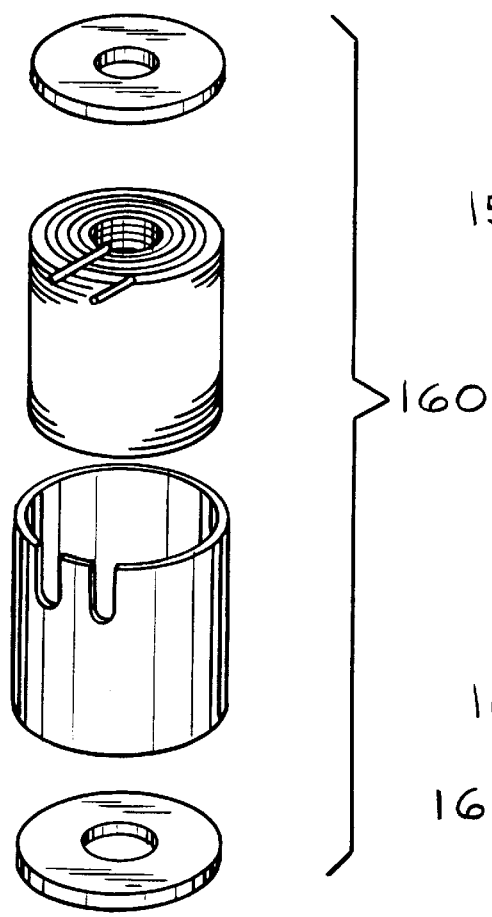
FIG. 15
FIG. 16
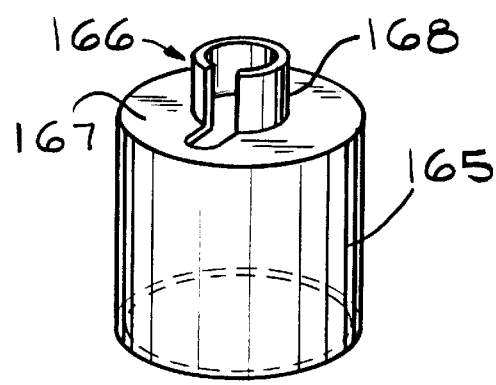
FIG. 17

6,120,114

SOLENOID COIL STRUCTURE AND INTERCONNECTION

CROSS REFERENCE TO RELATED APPLICATIONS

This application is a continuation of PCT/US97/14672 filed Aug. 20, 1997.

This application claims the benefit of U.S. Provisional Application Nos. 60/024,195, filed Aug. 20, 1996; 60/024,507 filed Aug. 23, 1996; and 60/24,997 filed Aug. 29, 1996.

BACKGROUND OF THE INVENTION

This invention relates in general to anti-lock brake systems and in particular to solenoid valve coil structure and interconnections within a removable anti-lock brake system electronic control module.

An Anti-lock Brake System (ABS) is often included as standard or optional equipment on new vehicles. When actuated, the ABS is operative to control the operation of some or all of the vehicle wheel brakes. A typical ABS includes a plurality of solenoid valves mounted within a control valve body and connected to the vehicle hydraulic brake system. Usually, a separate hydraulic source, such as a motor driven pump, is included in the ABS control valve body for reapplying hydraulic pressure to the controlled wheels during an ABS braking cycle. An ABS further includes an electronic control module which is electrically connected to the pump motor, a plurality of solenoid coils associated with the solenoid valves, and wheel speed sensors for monitoring the speed and deceleration of the controlled wheels. The electronic control module is typically mounted upon the control valve body with the assembled valve body, motor and control module forming a compact unit which is often referred to as an ABS control valve.

During vehicle operation, the ABS control module continuously receives speed signals from the wheel speed sensors. The control module monitors the speed signals for potential wheel lock-up conditions. When the vehicle brakes are applied and the control module senses an impending wheel lock-up condition, the control module is operative to actuate the pump motor and selectively operate the solenoid valves in the control valve to cyclically relieve and reapply hydraulic pressure to the controlled wheel brakes. The hydraulic pressure applied to the controlled brakes is adjusted by the operation of the solenoid valves to limit wheel slippage to a safe level while continuing to produce adequate brake torque to decelerate the vehicle as desired by the driver.

Referring now to FIG. 1, there is shown a partial sectional view of a portion of a typical ABS control valve 10. The control valve 10 includes a plurality of solenoid valves 11 (one shown) mounted in a valve body 12. Each of the solenoid valves 11 has a valve sleeve 13 which extends upwardly from the top surface of the valve body 12. Each valve sleeve 13 encloses an axially movable solenoid armature (not shown) which carries a valve ball on one end. As will be explained below, the valve sleeves 13 prevent loss of hydraulic fluid from the control valve 10 during servicing of the electronic control module.

Each valve 11 also includes a solenoid coil 15. As illustrated in FIG. 1, the coil 15 includes a winding 16 comprising a plurality of turns of fine wire wound upon a bobbin 17. The ends of the winding wire are wound onto a pair of rigid coil leads 18 which extend in an upward direction from the coil 15. An annular flux ring 20 is disposed between the coil 15 and the valve 11. A cylindrical flux casing 21 encloses the coil 15. A pair of lead apertures 22 are formed through the top surface of the casing 21. The coil leads 18 extend through the casing lead apertures 22 and through a second pair of apertures 23 formed through a Printed Circuit Board (PCB) 24. The PCB 24 has electrical traces 25 formed upon its top surface. The coil leads 18 are electrically connected to the traces 25 by a solder connection 26. Electricity is supplied through the electrical traces 25 and coil leads 18 to the coil 15. The coil 15 generates a magnetic flux field which actuates the solenoid valve 11. The flux ring 20 and flux casing 21 cooperate to provide a low reluctance return path for the magnetic flux field.

Typically, the PCB 24 carries a microprocessor and other electronic components (not shown) for controlling the ABS. As shown in FIG. 1, a removable cover 27 encloses the solenoid coils 15 and the PCB 24. The PCB 24 is usually attached to the cover 27 to form a compact integrated electronic control module 28. Because the valve sleeves 13 seal the associated solenoid valves 11, the electronic control module 28 can be removed from the control valve 10 for servicing the electronic control components without disturbing the vehicle hydraulic brake system.

SUMMARY

This invention relates to an improved solenoid valve coil structure and interconnections within a removable ABS electronic control module.

As described above, the leads of a solenoid valve coil have to be fed through the length of a flux casing and through two apertures formed through the far end of the casing. This requires a rather complex manufacturing operation. It would be desirable to provide a more easily assembled structure for the solenoid valve coil and flux casing assembly. It also would be desirable to reduce the size of the electronic control module to reduce the overall size of the ABS control valve package.

As also described above, to enhance serviceability of ABS electrical components, the leads for the solenoid valve coils are typically soldered to a printed circuit board which is mounted in a removable housing. When the housing is attached to a control valve body, each coil receives a valve sleeve which extends from the valve body and encloses a valve armature. A typical control valve usually includes six to eight solenoid valves. Because of cumulative component tolerances, or tolerance stackup, it is usually necessary to increase the inside diameter of the coils to permit alignment of all the coils with the associated valve sleeves. However, increasing the inside coil diameter can decrease the efficiency of the magnetic circuit. Accordingly, it would be desirable to provide an improved mounting structure for the solenoid valve coils which would accommodate the component tolerances.

The present invention contemplates a solenoid valve coil which includes a winding having at least one lead wire extending therefrom The winding is disposed within a cup shaped flux casing which has an open end with the winding lead wire extending from the open end of the casing. An annular flux ring is disposed within the open end of the flux casing adjacent to the winding. The flux ring having an aperture formed therethrough and the winding lead wire extends through the aperture. Additionally, the lead wire can be formed as a flexible free wire termination, the free wire termination being adapted to be electrically connected to a circuit substrate. The circuit substrate can include a printed circuit board or an overmolded lead frame. The overmolded lead frame cane be formed integrally with a housing.

It is further contemplated that the circuit substrate can be mounted within a housing which is adapted to be attached to an ABS valve body. The circuit substrate being positioned between the valve body and the solenoid coil. The circuit substrate has an aperture formed therethrough which is concentric with the solenoid coil. The circuit substrate aperture receiving a valve sleeve which extends into the solenoid coil. The circuit substrate can have an electronic device mounted thereupon, the electronic device being coupled to the housing whereby the housing forms a heat sink for said electronic device. A thermally conductive adhesive can be disposed between the electronic device and the housing to enhance the conduction of heat from the electronic device to the cover.

The invention also contemplates a solenoid coil having at least one lead wire which is electrically connected to a trace of conductive material formed upon a flexible backing material. The flexible backing material is carried by a housing with the flexible backing material permitting movement of the solenoid relative to the housing. It is further contemplated that the flexible backing material includes a first portion which carries the coil and a second portion mounted upon the housing. The first portion is joined to the second portion by a third portion of the flexible backing material which permits the coil to move relative to the housing and furthermore the conductive trace extends across the third portion of the flexible backing material between the first portion of the flexible backing material and the second portion of the flexible backing material.

Additionally, the first portion of said flexible backing material can be mounted upon a first backing substrate and the second portion of the flexible backing material can be mounted upon a second backing substrate. The second backing substrate is mounted upon the housing and is separated by a gap from the first backing substrate with the gap being bridged by the third portion of the flexible backing material.

Various objects and advantages of this invention will become apparent to those skilled in the art from the following detailed description of the preferred embodiment, when read in light of the accompanying drawings.

BRIEF DESCRIPTION OF THE DRAWINGS

FIG. 6 is an exploded perspective view of the coil mounting structure shown in FIG. 5.

FIG. 10 is sectional view of an alternate mounting structure in accordance with the invention.

FIG. 11 is an exploded perspective view of the mounting structure shown in FIG. 10.

FIG. 14 is a perspective view of an alternate configuration of the flux ring shown in FIG. 13.

FIG. 15 is an exploded perspective view of a flux casing in accordance with the invention.

FIG. 16 is an exploded perspective view of an alternate embodiment of the flux casing shown in FIG. 15.

FIG. 17 is a perspective view of a slotted flux casing in accordance with the invention.

DETAILED DESCRIPTION OF THE PREFERRED EMBODIMENT

Figure 1:
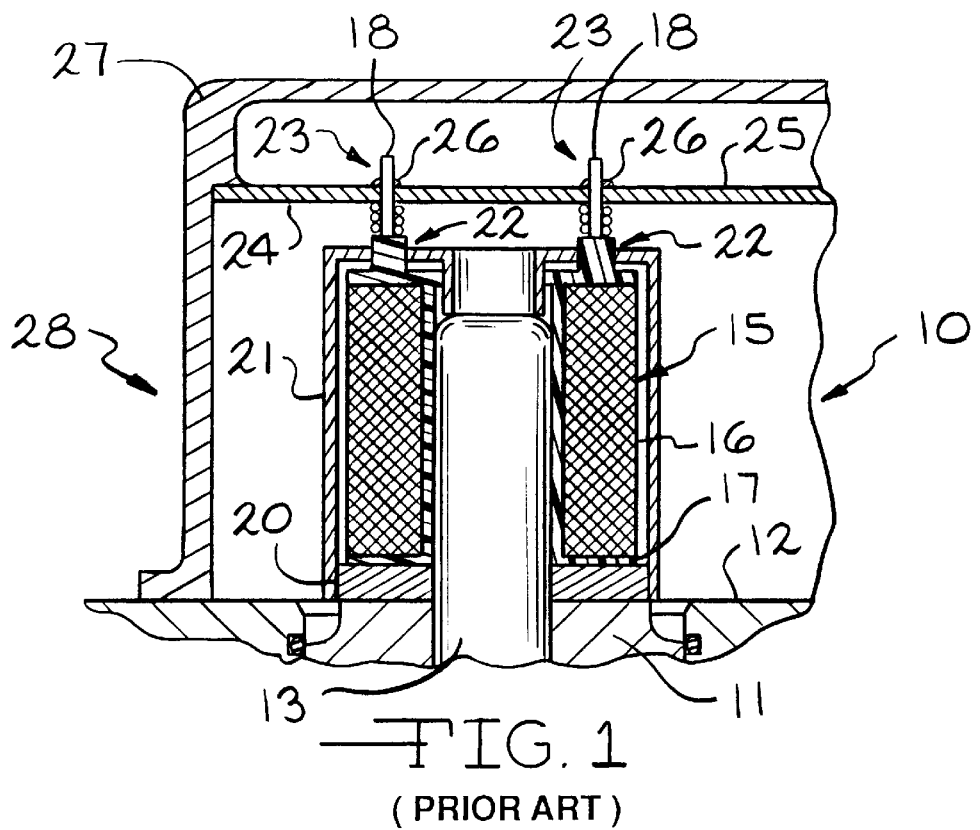
FIG. 1 is a partial sectional view of a portion of an ABS control valve illustrating a solenoid coil according to the prior art.
Figure 2:
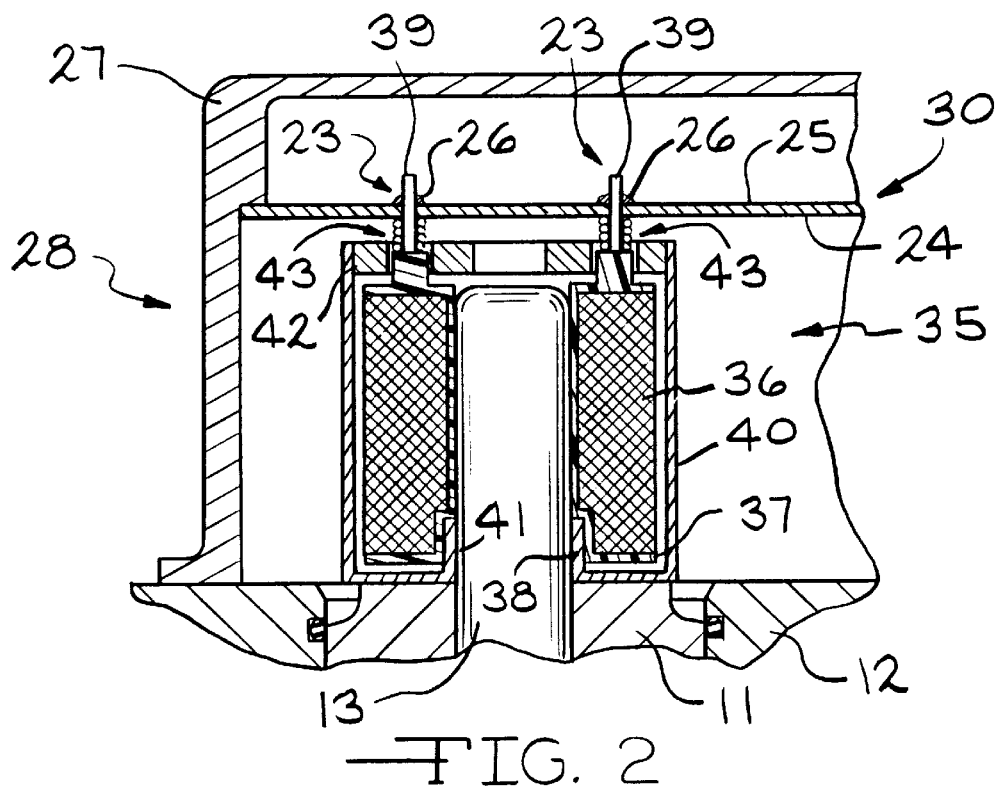
FIG. 2 is a partial sectional view of a portion of an ABS control valve illustrating an inverted solenoid coil in accordance with the invention.

Referring again to the drawings, there is illustrated in FIG. 2, a partial sectional view of a portion of an improved ABS control valve 30 having an inverted solenoid valve coil 35 in accordance with the invention. Components in FIG. 2 which are similar to components shown in FIG. 1 are identified by the same numerical designators. While only one coil 35 is shown in the figure, it will be appreciated that a typical ABS control valve includes a plurality of solenoid coils.

As illustrated in FIG. 2, the coil 35 includes a winding 36 comprising a plurality of turns of fine wire wound upon a bobbin 37. The lower end of the bobbin 37 has a cylindrical recess 38, the purpose of which will be described below. The ends of the winding are secured to a pair of rigid wire wound coil leads 39 which extend in an upward direction from the coil 35. The coil 35 is disposed in a cup-shaped flux casing 40. The lower end of the casing 40 includes an annular sleeve 41 which extends axially into the bobbin recess 38 to align the bobbin 37 and winding 36 within the casing 40.

An annular flux ring 42 is disposed in the open upper end of the casing 40 adjacent to the upper end of the coil 35. The flux ring 42 has a pair of lead apertures 43 formed therethrough. As shown in FIG. 2, the coil leads 39 extend through the lead apertures 43 in the flux ring 42. The upper end of the flux casing 40 is secured to the flux ring 42 by a conventional process, such as crimping, press fitting, welding or bonding.

Similar to the prior art coil 15 described above, a PCB 24 mounted within a cover 27 is positioned adjacent to the upper end of the coil 35. A pair of coil lead apertures 23 are formed through the PCB 24. The coil leads 39 extend through the PCB coil lead wire apertures 47 and are electrically connected by solder connections 26 to wire traces 24 formed upon the upper surface of the PCB 24. The solder connections 26 also secure the coil 35 to the PCB 24.

Also similar to the prior art coil 15 described above, the cover 27 is mounted upon a control valve body 12 which carries a plurality of solenoid valves 11 (one shown). The valve 11 includes a valve sleeve 13 which extends in an upward direction from the valve body 12 in FIG. 2 and is received by the bobbin 37. Alternately, the coil 35 can be mounted upon an overmolded lead frame (not shown) which can be optionally included as a portion of a molded electronic control module housing (not shown).

The structure of the inverted coil 35 described above is closely related to the prior art coil 15 illustrated in FIG. 1. However, while the prior art coil 15 requires that the coil leads 18 be fed through the length of the deep drawn flux casing 21 before they can be aligned with the casing lead apertures 22, the inverted coil 35 illustrated in FIG. 2 provides a simpler structure for manufacturing solenoid coils. The coil 35 is simply inserted into the casing 40 and the flux ring 42 is placed over the exposed coil end with the coil leads 39 extending through the flux ring lead apertures 43. The flux casing 40 is then secured to the flux ring 42 as described above.

When rigid coil leads, as shown in FIGS. 1 and 2, are soldered to a printed circuit board or an insert molded module housing lead frame (not shown), it can become difficult to align the coils with the corresponding valve sleeves. In the past, the clearance between the coil bobbin and the valve sleeve has been increased to compensate for any misalignment. Unfortunately, increasing the clearance typically can degrade the coil magnetic circuit and require higher currents to generate the same magnetic flux strength in the vicinity of the valve armature.

Figure 3:
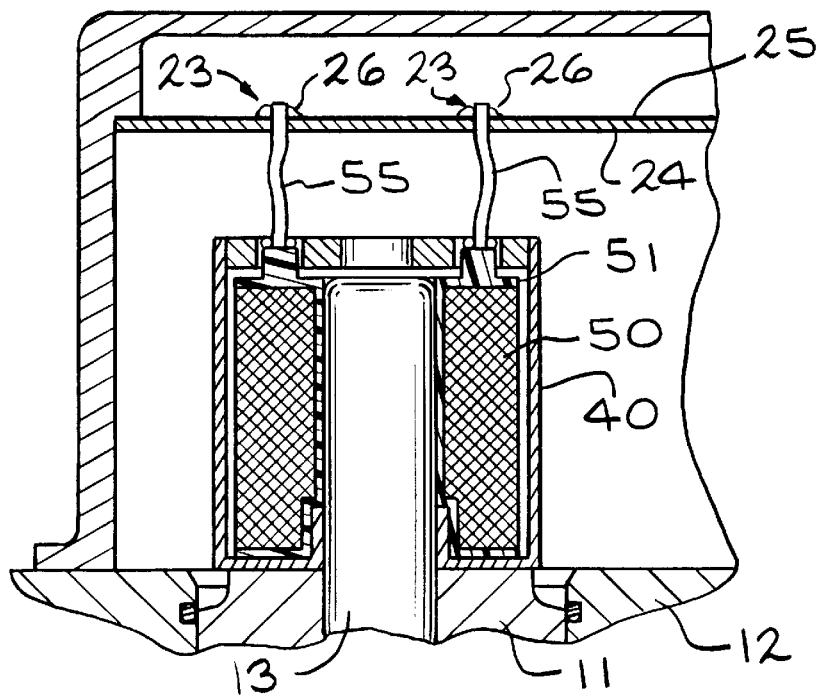
FIG. 3 is alternate embodiment of the solenoid coil shown in FIG. 2 which has flexible free wire terminations.

The present invention contemplates an alternate embodiment of the invention comprising an inverted coil 50 wound upon a bobbin 51 and having a pair of flexible free wire terminations 55, as illustrated in FIG. 3. The flexibility of the free wire terminations 55 allow the coil 50 to move relative to the PCB 24 for alignment with the associated valve sleeve 13. Thus, the free wire terminations 55 also allow a reduction of the clearance between the bobbin 51 and the valve sleeve 13. As is apparent from FIG. 3, it would be difficult to feed the free wire terminations 55 through a prior art flux casing and align the terminations with the flux casing lead apertures. However, as discussed above, the inverted coil structure illustrated in FIG. 3 eliminates the need to feed the free wire terminations 55 through the length of the flux casing 40. Accordingly, the structure illustrated in FIG. 3 is simpler to assemble than the prior art structure shown in FIG. 1.

To further enhance the magnetic field, the present invention also contemplates another embodiment of the invention having a bobinless inverted coil (not shown). The bobbinless coil, which is described in co-pending U.S. patent application Ser. No. 08/811,667, is formed by winding magnet wire with a special heat activated adhesive coating on a production mandrel. The coil is temporarily bonded on the production mandrel by passing an electric current through the winding which heats the adhesive sufficiently to bind the together the winding coils. The coil is later permanently bonded by batch heating in a curing oven. The coil can be wound with a thin one mil layer of Kaptan on the inside, outside, top and/or bottom, if needed, for wear resistance. The coil also has a pair of flexible free wire terminations, as described above. The bobinless coil further enhances the magnetic circuit by decreasing the spacing between the coil and the valve sleeve 13.

Figure 4:
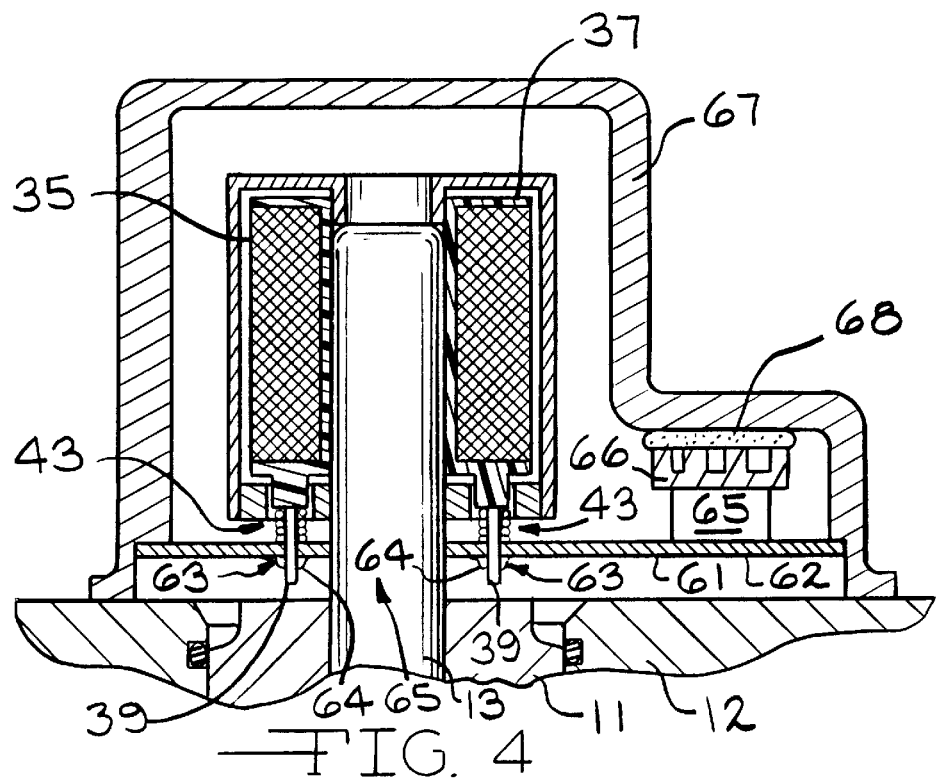
FIG. 4 is a partial sectional view of an ABS control valve illustrating an alternate mounting structure for the solenoid coil shown in FIG. 2.

The invention further contemplates an alternate mounting structure for the inverted coil 35 which is illustrated in FIG. 4, where a PCB 61 is disposed between the coil 35 and the control valve body 12. As before, components shown in FIG. 4 which are similar to components shown in FIG. 2 are identified with the same numerical designators.

A plurality of electrical traces 62 are deposited on the bottom surface of the PCB 61 for supplying electric currents to the coil 35. A pair of coil lead apertures 63 which correspond to the leads 39 the coil 35 are formed through the PCB 61. The coil leads 39 pass though the coil lead apertures 63 and are electrically connected to the traces 62 by solder connections 64. Alternately, the coil leads can be flexible free wire terminations which are fed through holes formed in the PCB 39 and soldered to the traces 41. A plurality of valve openings 65 (one shown) are formed through the PCB 61 which correspond to valve sleeves 13. Each valve sleeve 13 extends through the corresponding PCB valve opening 65, through the center of the flux ring 42 and into the bobbin 37.

A Field Effect Transistor (FET) 65 is mounted upon the top surface of the PCB 61 and functions as an electronic switch to supply electrical current to the solenoid coil 35. The FET 65 is connected by the electrical traces 62 to the coil 35. A heat sink 66 is mounted upon the FET 65 to dissipate heat generated when the FET 65 is switched to its conducting state. In the preferred embodiment, a cover 67 is formed from a heat conductive material and the heat sink 66 extends upward and into contact with the cover 67 to increase the heat dissipation capacity of the heat sink 66. A thermally conductive adhesive 68 can optionally be disposed between the top surface of the heat sink 66 and the cover 67 to enhance the conduction of heat from the heat sink 66 to the cover 67. While only one coil 35 and corresponding FET 65 are shown in FIG. 4, it will be appreciated that the invention can be practiced upon a plurality of coils and associated FET's. Also, as described above, additional electronic components for controlling the ABS can be mounted upon the PCB 61 and connected by the traces 62. The invention further contemplates that the cover 67 can be utilized as a heat sink for the additional electronic components (not shown).

By mounting the PCB 61 between the coil 35 and the valve body 12, the portion of the cover 67 which encloses the electronic components, such as the FET 65 has a lowered height as compared to prior art covers. Accordingly, the electronic control module has a lower profile than prior art modules. Thus, the overall package size of a control valve utilizing the alternate mounting structure is reduced from the volume of prior art valves. Additionally, it will be appreciated that while a PCB 61 has been shown in FIG. 4, the alternate structure also can include an overmolded lead frame (not shown) mounted between the coils and the valve body. Furthermore, while the mounting structure has been illustrated with an inverted coil, it will be appreciated that the mounting structure also can be utilized to mount a conventional prior art coil as shown in FIG. 1.

Figure 5:
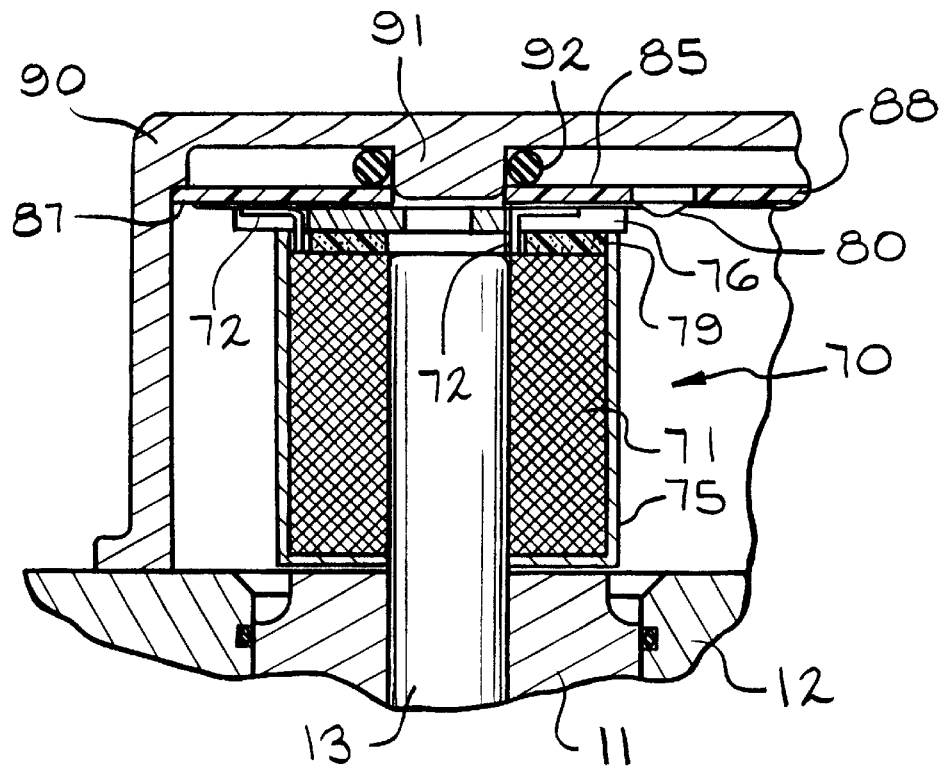
FIG. 5 is a partial sectional view of a portion of an ABS control valve illustrating a solenoid coil mounting structure in accordance with the invention.

Referring again to the drawings, there is illustrated in FIG. 5, a partial sectional view of a portion of an ABS control valve which includes another embodiment, shown generally at 70, of an inverted solenoid coil assembly and an improved coil mounting structure. An exploded perspective view of the coil assembly 70 is shown in FIG. 6. As before, components in FIGS. 5 and 6 which are similar to components shown in FIGS. 2 through 4 have the same numerical designators.

In the preferred embodiment, the coil assembly 70 includes a bobbinless solenoid coil 71 which is formed by winding magnet wire with a special adhesive coating on a production mandrel. As best seen in FIG. 6, the coil 71 includes a pair of free standing coil leads 72. The end of each coil lead 71 is stripped and bent back upon itself to facilitate forming a surface solder connection. While a bobbinless coil 71 is shown in FIG. 5, it will be appreciated that the invention also can be practiced with a convention coil wound upon a bobbin, as illustrated in FIG. 2.

Similar to the prior art structure described above, the coil 71 receives a valve sleeve 13 which extends in an upward direction in FIG. 5 from a solenoid valve 11. The valve 11 is mounted in an ABS valve body 12. For simplicity, only one solenoid valve 11 is shown in FIG. 5; however, the inverted coil assembly 70 illustrated in FIGS. 5 and 6 would be included with all of the solenoid valves mounted in the valve body 12.

The coil 71 is enclosed in a metal flux casing 75. A stamped steel flux ring 76 is disposed in the open end of the casing 75 to form a coil and casing assembly. The flux ring 76 is secured within the end of the casing 75 by a conventional process, such as crimping, adhesive bonding or spot welding. A pair of notches 77 are formed through the flux ring 76 and receive the coil leads 72. As best seen in FIG. 6, a pair of tabs 78 extend from the end of each notch 77. The tabs 78 protect the coil leads 72 from damage before assembly of the control valve. A resilient foam disc 79 is disposed between the upper end of the coil 71 and the flux ring 76 to prevent relative motion between the coil 71 and the flux casing 75 or other components. Alternately, the coil 71 can be adhesively bonded to the flux casing 75 (not shown).

The coil assembly 70 includes a mounting formed from a flexcircuit 80 which comprises electrical traces 81 for supplying electricity to the coil 71 disposed upon a thin and flexible non-conductive backing material. The ends of the coil leads 72 are soldered to the electrical traces 81. Additionally, in the preferred embodiment, a metal edging 82 can be included upon the flexcircuit 81. The flux casing 75 is soldered to the edging strip 82 to attach the coil and casing assembly to the flexcircuit 80. Alternately, the flux ring 76 can be side staked to the flux casing 75 and the flux ring 76 and/or the flux casing 75 bonded in position on the flexcircuit 80. As best seen in FIG. 6, a circular opening 83 is formed through the center of the flexcircuit 81.

Figure 7:
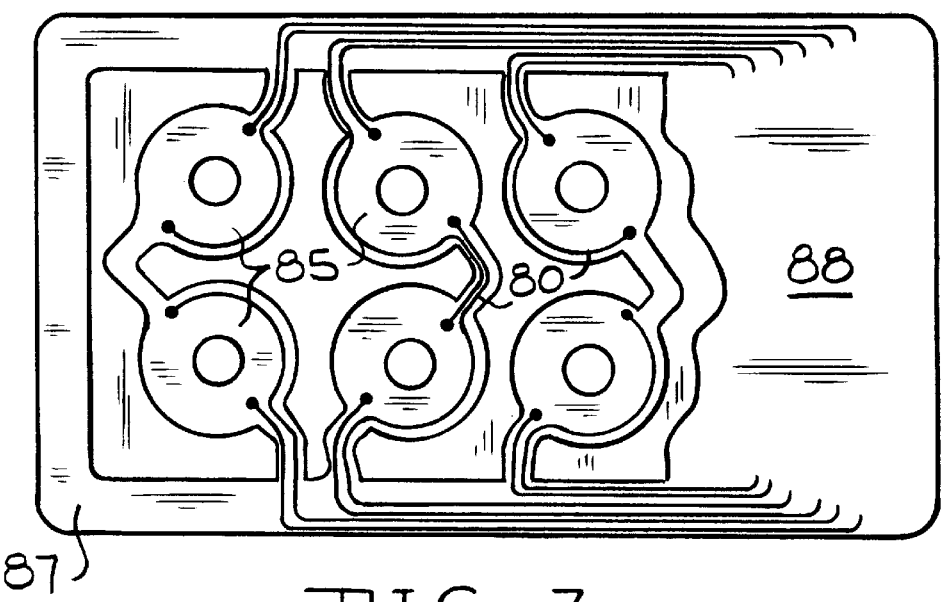
FIG. 7 is a plan view of the printed circuit board shown in FIG. 5.

The portion of flexcircuit 80 supporting the coil assembly is attached to a disc-shaped solenoid base 85 by a conventional method, such as adhesive bonding. The solenoid base 85 is formed from a sub-base material and has a circular opening 86 formed through the center thereof. The sub-base material can be a non-conducting ceramic or printed circuit board substrate and is relatively thick, having a thickness, in the preferred embodiment, of approximately two mm. As best seen in FIG. 7, which is a plan view of a flexcircuit configuration for a control valve having six solenoid valves, each solenoid coil is provided a solenoid base 85. The flexcircuit 80 extends across non-backed gaps between the solenoid bases 85 and a peripheral frame 87 formed from the same thick sub-base material. The flexcircuit 80 is secured to the peripheral frame 87 by a conventional method, such as adhesive bonding. In the preferred embodiment, the frame 87 includes a portion 88 which carries the electronic components (not shown) for controlling the ABS.

As shown in FIG. 7, the non-backed portions of flexcircuit 80 which bridge the gaps between the solenoid bases 85 and the peripheral frame 87 are formed having multiple angled, or "zigzag", paths. The zigzag paths provide lateral flexibility for each of the coil and casing assemblies relative to the peripheral frame 87. The lateral flexibility accommodates the tolerance stackup of the various components and allows alignment of the coils 71 with the valve sleeves 13. Accordingly, the inside diameter of the coils 71 can be reduced, improving the efficiency of the magnetic circuit.

As shown in FIG. 5, the peripheral frame 87 is supported within a cover 90. The cover has a plurality of bosses 91 (one shown) formed on the inner surface thereof which extend into the opening 86 of an associated coil base 85. An O-ring 92 is disposed around each of the bosses 91 and urges the associated coil base 85 in a downward direction in FIG. 5 to provide axial spring loading to the coil and casing assembly 70.

Figure 8:
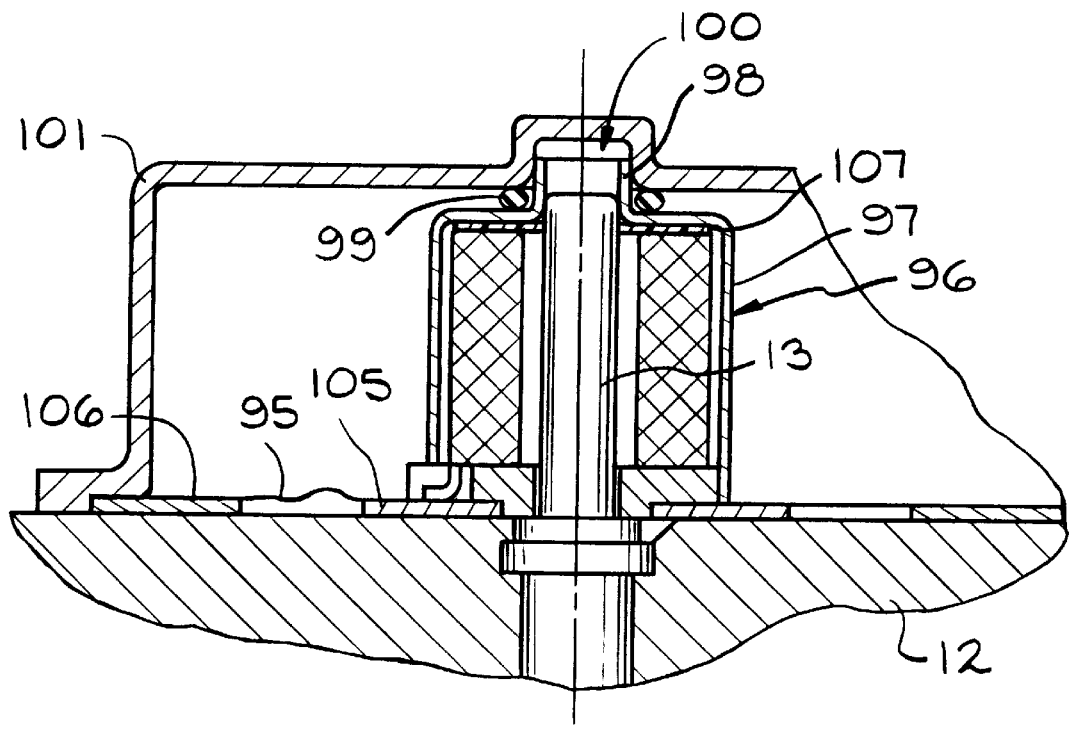
FIG. 8 is an alternate embodiment of the mounting structure shown in FIG. 2.
Figure 9:
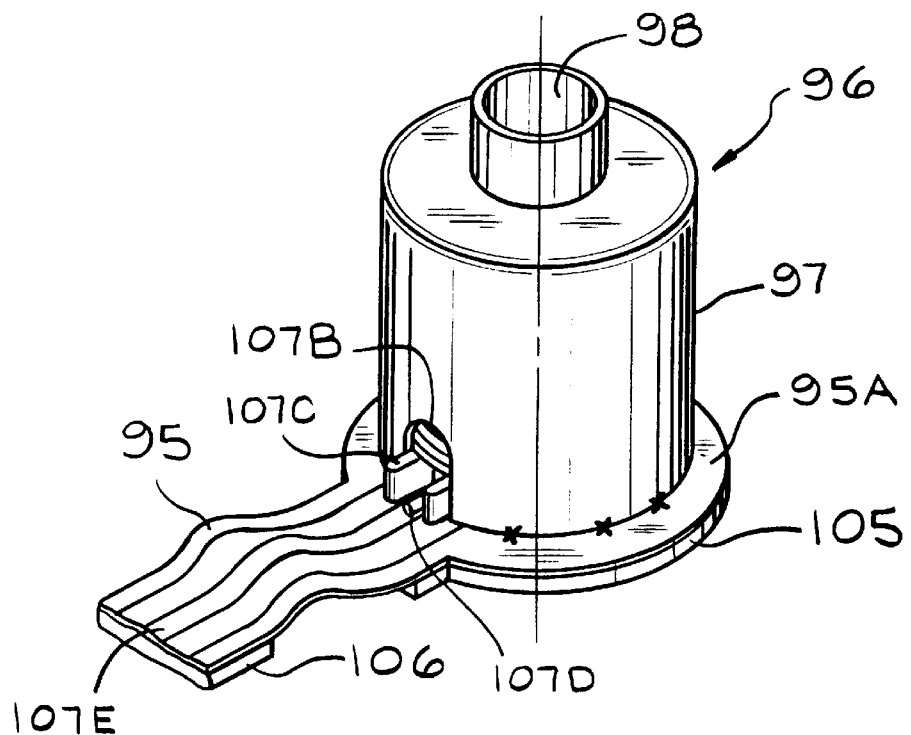
FIG. 9 is a perspective view of the coil shown in FIG. 8.

An alternate embodiment of the invention is illustrated in FIGS. 8 and 9 wherein a flexcircuit 95 which forms a flexible substrate is disposed between a coil assembly 96 and a valve body 12. The coil assembly 96 includes a flux casing 97 which has a cylindrical portion 98 extending axially from a first end 97A thereof. The flux casing 97 also has a second end 97B. A resilient O-ring 99 is disposed about the cylindrical portion 98. As shown in FIG. 8, the cylindrical portion 98 of the flux casing 97 extends into an associated recess 100 formed in a control module cover 101. When the control module is assembled, the 0-ring 99 is compressed between the flux casing 97 and the cover 101 and urges the coil assembly 96 in a downward direction in FIG. 8 against the valve body 12. It will be appreciated that, while only one coil assembly 96 is illustrated in FIG. 8, the invention can be practiced upon multiple coil assemblies (not shown).

As described above, the flexcircuit 95 forms a flexible substrate which bridges gaps between individual coil bases 105 and a peripheral frame 106 formed from a thick sub-base material. In the preferred embodiment, the flex circuit includes a metallic mounting ring 95A. The gaps in the sub-base material between the coil bases 105 and the frame 106 allow lateral movement of the coil assemblies 96 relative to the frame 106 for alignment of the coils with associated valve sleeves 13. In the embodiment shown, the coil assembly 96 is secured to the flexcircuit 95 with solder or adhesive joints formed along a plurality of arcuate portions of the flux casing, which are labeled with "X's" in FIG. 9. As described above, a first disc 107 formed from a resilient material is included in the first end 97A of the flux casing 97 to axially spring load the coil against the other components. A second disc 107A is disposed in the second end of the flux casing 97. As best seen in FIG. 9, a slot 107B is formed in the side of the flux casing 97. A slotted post 107C formed upon the second disc 107A extends through the flux casing slot 107B. A coil lead 107D is disposed within the slotted post 107C and electrically connected to a trace of conductive material 107E which is deposited upon the flexible substrate 95.

The present invention further contemplates an alternate coil mounting structure which is illustrated at 110 in FIGS. 10 and 11. In the preferred embodiment, the structure 110 includes a bobbinless coil 111 having at least one flexible lead 112 (two shown); however, it will be appreciated that the invention also can be practiced with a coil wound upon a bobbin (not shown). The coil 111 is disposed within a cylindrical flux casing 113 to form a coil assembly 114. The upper end of the flux casing 113 is formed with an annular shoulder 115 and a central collar 116 which extends in an upward axial direction. A flux ring 117 is attached to the lower end of the flux casing 113 by a conventional process, such as crimping, adhesively bonding or spot welding. As described above, a resilient foam ring 118 is disposed between the coil 111 and the flux ring 118 to prevent movement of the coil 111 within the casing 113. Alternately, the coil 111 can be adhesively bonded to the casing 113.

The coil assembly 114 is attached to a Printed Circuit Board (PCB) 120. The flux casing collar 116 extends through a mounting hole 121 formed through the PCB 120. The diameter of the mounting hole 121 is greater than the diameter of the casing collar 116 to allow lateral movement of the casing 113 relative to the PCB 120. Additionally, an oversized lead hole 122 is formed through the PCB 120 and receives the coil leads 112. The coil leads 112 are formed into loops and soldered to electrical traces disposed upon the top surface of the PCB 120. A flex washer 125 is disposed over the casing collar 116. A snap cap 126 is pressed onto the end of the upper end of the casing collar 116 to retain the coil assembly 114 upon the PCB 120. The snap cap 126 and flex washer 125 cooperate with the PCB 120 to secure the coil assembly 114 upon the PCB 120. The oversized mounting and lead holes 121 and 122 and the loops formed in the flexible leads 112 allow lateral movement of the coil assembly 114 relative to the PCB 120, as shown by the small directional arrows in FIG. 10. This lateral movement permits alignment of the coil 111 with a corresponding valve sleeve (not shown) when the ABS control valve is assembled.

Figure 12:
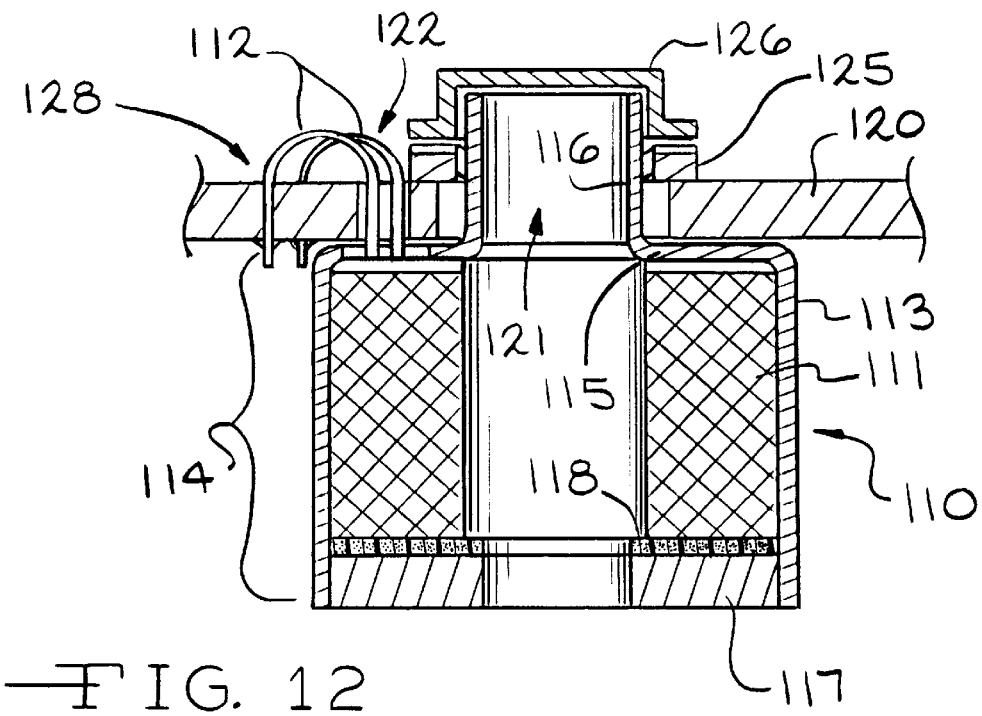
FIG. 12 is sectional view of an alternate embodiment of the mounting structure shown in FIG. 10.

An alternate embodiment of the mounting structure shown in FIG. 10 is illustrated in FIG. 12. The components in FIG. 12 which are similar to the components shown in FIG. 10 have the same identifying numerals. In FIG. 12, the bobbinless coil and casing assembly 110 is mounted on a PCB 120 having a pair of lead wire return holes 128 (one shown) formed therethrough. The coil lead wires 112 pass through the coil lead hole 122 and, after being formed into a loop, return through the lead wire return holes 128. The ends of the lead wires 112 are soldered to the electrical traces formed upon the bottom surface of the PCB 120. The loops formed in the lead wires 112 accommodate lateral movement of the coil 114 relative to the PCB 120.

Figure 13:
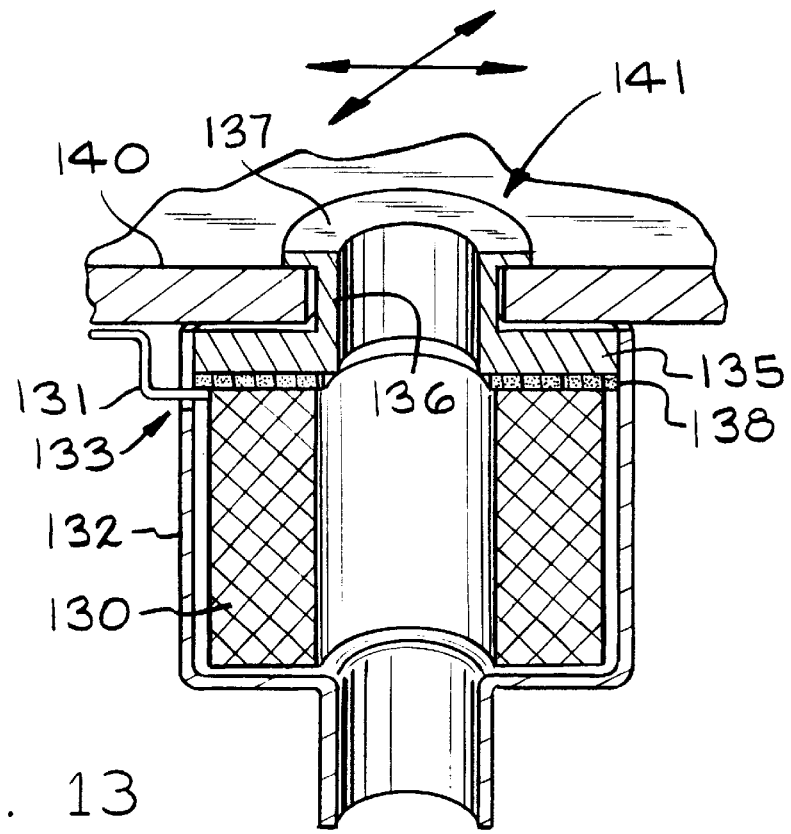
FIG. 13 is a sectional view of another alternate embodiment of the mounting structure shown in FIG. 10.

Another alternate mounting structure is illustrated in FIG. 13 where a bobbinless coil 130 having at least one flexible lead 131 is disposed in a flux casing 132 having slot 133 formed through its side. The structure further includes a flux ring 135 which is attached to the open upper end of the casing 132. The flux ring 135 is formed with an axial collar 136. During assembly of the ABS control module, the upper end of the collar 136 is flared outward with an eyelet machine or mandrel to form a retaining ring 137. Alternately, the ring 137 can be formed by cone swaging the upper end of the collar 136. Similar to the structures described above, a resilient foam ring 138 is disposed between the flux ring 135 and the coil 130.

The coil 130 and casing 132 are mounted upon a PCB 140. The PCB 140 has a mounting aperture 141 formed therethrough having a diameter which is greater than the outer diameter of the flux ring collar 136. Additionally, electrical traces (not shown) are disposed upon the bottom surface of the PCB 140. The flux ring collar 136 extends through the mounting aperture 141 and the upper end of the collar 136 is formed into the retaining ring 137 to retain the casing 132 and coil 130 on the PCB 140. The coil lead 131 extends through the casing slot 133 and is formed into a partial loop before being soldered to an electrical trace (not shown) on the PCB 140. Because the mounting aperture 141 is larger than the diameter of the flux ring collar 136 and the lead wire includes a partial loop, the casing 132 and coil 130 can move laterally relative to the PCB 140, as illustrated by the small directional arrows in FIG. 13.

An alternate structure for the flux ring is illustrated at 145 in FIG. 14. The alternate flux ring 145 has a plurality of tabs 146 extending radially from a collar 147. The tabs 146 are inserted through corresponding slots extending radially from the mounting aperture formed through the PCB (not shown). The coil and casing attached to the flux ring 145 are then twisted relative to the PCB to retain the coil and casing on the PCB.

The present invention also contemplates simplified three piece flux casing structures which are illustrated with exploded perspective views in FIGS. 15 and 16. In FIG. 15 a flux casing 150 includes a cylindrical section of tubing 151. In the preferred embodiment, a bobbinless coil 152 having a pair of flexible leads 153 is disposed within the tubing section 151; however, it will be appreciated that the invention also can be practiced with a coil wound upon a bobbin (not shown). A first flux ring 154 having a slot 155 formed therein is attached by a conventional method, such as crimping, spot welding or adhesively bonding, to the upper end of the tubing section 151. The coil leads 153 extend through the flux ring slot 155. Similarly, a second flux ring 156 is attached to the lower end of the tubing section 151. An optional plastic insulator 157 may be inserted in the slot 155 in the first flux ring 154. A pair of grooves 158 formed in the insulator 157 receive the coil leads 153.

An alternate embodiment of the three piece casing structure is shown at 160 in FIG. 16. The casing 160 is similar to the structure shown in FIG. 15, but has a pair of slots formed through the side of the casing tubing section to accommodate side terminals for the coil.

FIG. 17 shows another structure for a flux casing 165 which has a coil lead slot 166 formed though both the upper surface 167 and the collar 168 of the casing 165.

Figure 18:
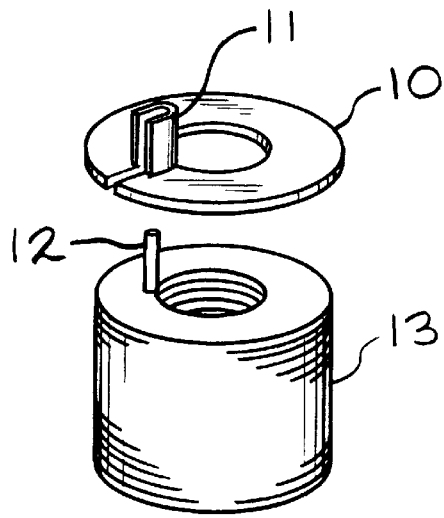
FIG. 18 is a perspective view of a flux casing end cap in accordance with the invention.

A molded end cap 170 for a flux casing (not shown) is illustrated in FIG. 18. The end cap 170 includes a slotted post 171 which receives a lead wire 172 of a bobbinless coil 173. As shown in FIG. 18, the slot extends across the end cap 170 to facilitate insertion of the lead wire 172.

Figure 19:
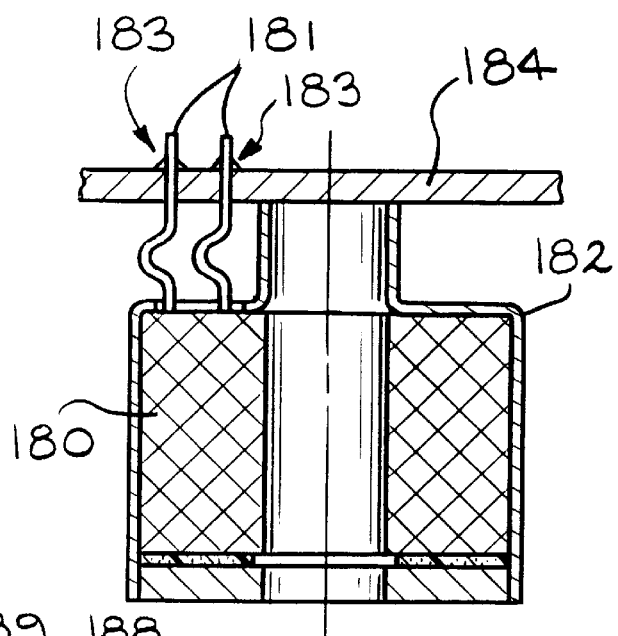
FIG. 19 is a sectional view of printed circuit board connection in accordance with the invention.

Another coil lead attachment structure is illustrated in FIG. 19. In FIG. 19, a bobbinless coil 180 having a pair of flexible lead wires 181 is disposed in a flux casing 182. The lead wires 181 extend through a slot formed in the casing 182. The ends of the lead wires 181, which extend through corresponding lead holes 183 formed through a PCB 184, are soldered to electrical traces (not shown) disposed upon the top surface of the PCB 184. The lead wires 181 are formed into a "S"-shape between the flux casing 182 and the PCB 184. The "S"-shape accommodates axial displacement of the coil 180 and casing 182 relative to the PCB 184 due to component tolerances.

Figure 20:
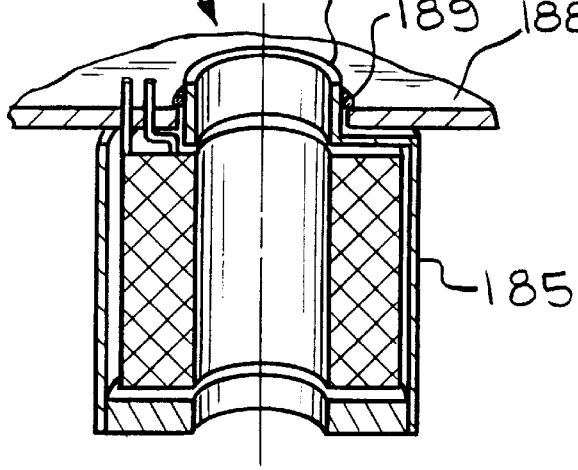
FIG. 20 is perspective sectional view of a rigid mounting structure in accordance with the invention.

For a distributed ABS having only one or two solenoid valves mounted in a valve body, the present invention contemplates a rigid attachment of the solenoid coils to a PCB as shown in FIG. 20. In FIG. 20, a flux casing 185 has a collar 186 which extends through an aperture 187 formed through a PCB 188. A circumferential ring of metallic material 189 is disposed on the top surface of the PCB 188 around the aperture 187. The flux casing 185 is soldered to the metallic ring 189 to secure the casing 185 to the PCB 188. Alternately, the casing 185 can be spot welded to the ring 189.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. For example, while the invention has been described for an anti-lock brake system, it will be appreciated that the invention also can be practiced with other applications involving solenoid valves, such as, for example, traction control and vehicle stability control systems. In addition, features shown in one embodiment may be included in another embodiment; and, while a number of the preferred embodiments of the invention have been illustrated with bobbinless coils, it will be appreciated that the invention also can be practiced with conventional coils wound upon bobbins.

What is claimed is:

1. A solenoid coil support structure comprising:
   a flexible substrate formed from a flexible material, said flexible substrate including a first and a second portion, said first portion being connected to said second portion by a third portion;
   a solenoid coil having at least one lead wire mounted upon said first portion of said flexible substrate;
   a first rigid supporting substrate, said first rigid supporting substrate carrying said first portion of said flexible substrate;
   a second rigid supporting substrate, said second rigid supporting substrate being separate from said first rigid supporting substrate, said second rigid supporting substrate carrying said second portion of said flexible substrate;
   a trace of conductive material disposed upon said flexible substrate, said coil lead wire electrically connected to said trace; and
   a housing carrying said second rigid supporting substrate with said third portion of said flexible substrate permitting movement of said solenoid coil relative to said housing.

2. A coil support structure according to claim 1 wherein said conductive trace extends across said third portion of said flexible substrate between said first portion of said flexible substrate and said second portion of said flexible substrate.

3. A coil support structure according to claim 1 wherein said second supporting substrate is separated by a gap from said first supporting substrate, said gap being bridged by said third portion of said flexible substrate.

4. A coil support structure according to claim 3 wherein said coil is a bobbinless coil having at least one flexible lead wire extending therefrom.

5. A coil support structure according to claim 3 wherein said coil is disposed within a metal flux casing; said flux casing being adhesively bonded to said first portion of said flexible substrate.

6. A coil support structure according to claim 3 wherein said coil is disposed within a metal flux casing and said second portion of said flexible substrate carries a metallic mounting ring, said flux casing being soldered to said metallic mounting ring.

* * * * *